United States Patent [19]
Chesnoy

[11] Patent Number: 5,640,268
[45] Date of Patent: Jun. 17, 1997

[54] OPTICAL FIBER AMPLIFIER WITH TWO DIRECTIONAL PUMPING

[75] Inventor: José Chesnoy, Paris, France

[73] Assignee: Alcatel N.V., Rijswijk, Netherlands

[21] Appl. No.: 606,298

[22] Filed: Feb. 23, 1996

[30] Foreign Application Priority Data

Feb. 28, 1995 [FR] France ................... 95 02298

[51] Int. Cl.$^6$ ....................................... H01S 3/00
[52] U.S. Cl. ............................................ 359/341
[58] Field of Search ................... 359/341; 372/6

[56] References Cited

U.S. PATENT DOCUMENTS

| | | |
|---|---|---|
| 5,140,456 | 8/1992 | Huber . |
| 5,323,404 | 6/1994 | Grubb ........................................ 372/6 |
| 5,327,282 | 7/1994 | Takeda et al. ............................ 359/341 |
| 5,404,413 | 4/1995 | Delavaux et al. ........................ 385/15 |
| 5,434,702 | 7/1995 | Byron ........................................ 359/341 |
| 5,530,583 | 6/1996 | Uno et al. ................................. 359/341 |

FOREIGN PATENT DOCUMENTS

0459685A2  12/1991  European Pat. Off. .
0522201A1   1/1993  European Pat. Off. .

OTHER PUBLICATIONS

C. R. Giles et al, "Simultaneous Wavelength–Stabilization of 980–nm pump laser", *IEEE Photonics Technology Letters*, vol. 6, No. 8, 1908–1994 New York US, pp. 907–909, XP 000465479.

*Primary Examiner*—Mark Hellner
*Attorney, Agent, or Firm*—Sughrue, Mion, Zinn, Macpeak & Seas

[57] ABSTRACT

An amplifying fiber is connected at both ends to two respective pump-forming semiconductor lasers. The connections are made via two pump injection fibers and two multiplexers. According to the invention, each of the two pump injection fibers includes a respective photorefractive filter constituting a portion of the resonant cavity of the associated pump, and serving to separate the spectrum bands of the pumps. The invention is particularly applicable to optical fiber telecommunications networks.

5 Claims, 1 Drawing Sheet

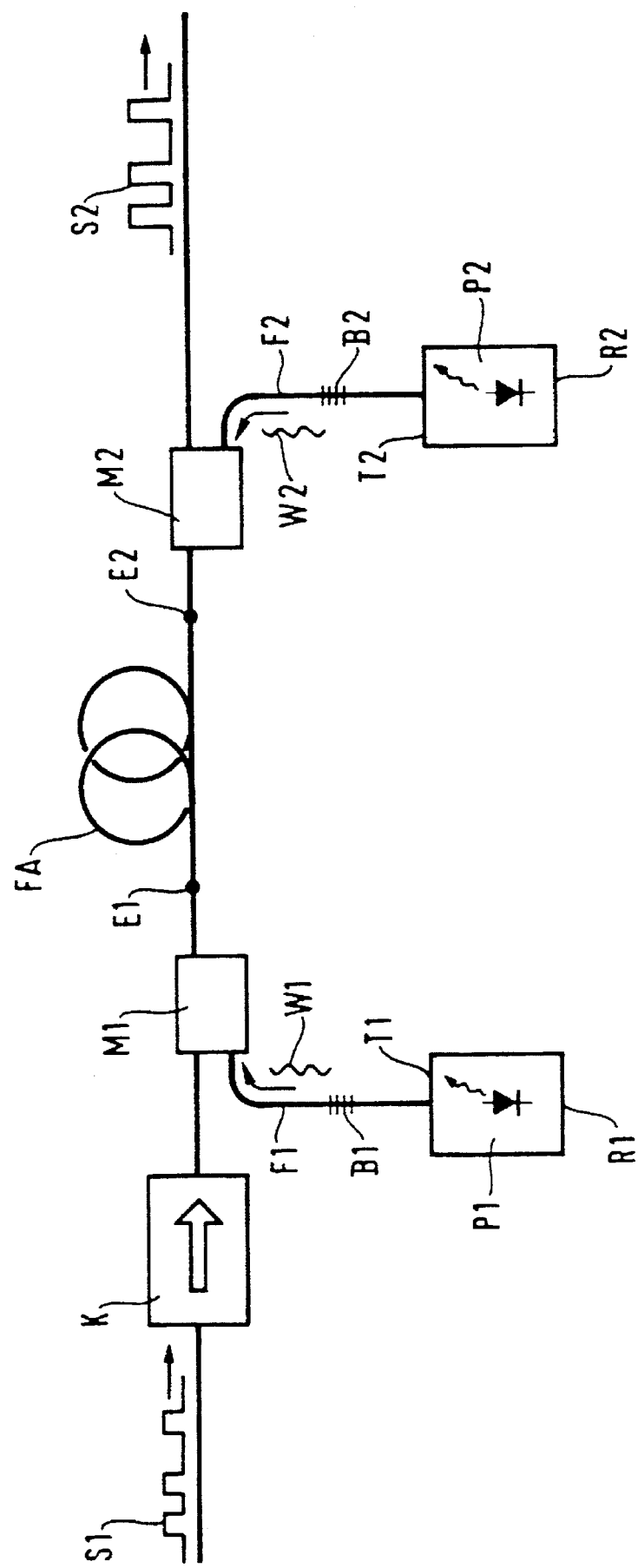

OPTICAL FIBER AMPLIFIER WITH TWO DIRECTIONAL PUMPING

FIELD OF THE INVENTION

The present invention relates to an optical fiber amplifier with two-directional pumping.

An amplifier of the present invention includes the following known elements:

an amplifying fiber extending between two ends for receiving, guiding, amplifying, and transmitting optical signals that are to be amplified;

two pumps, each comprising a resonant cavity containing a stimulated emission structure for generating a pump wave, the spectrum band occupied by such a pump wave constituting a pumping band and being selected to enable the amplifying fiber to be pumped, the pumps typically being constituted by semiconductor laser diodes; and two pump injection fibers associated with the two pumps for injecting the two pump waves into the two ends of the amplifying fiber via two respective multiplexers.

BACKGROUND OF THE INVENTION

Known amplifiers may suffer instability because the wave emitted by each pump is not fully absorbed in the amplifying fiber and therefore comes to disturb the operation of the other pump.

It is known that such instability can be avoided by placing an isolator on the optical path of each of the pumps. Proposals have also been made, for the same purpose, to use two pumps made of different materials, so that one operates at a wavelength of 1480 nm while the other operates at a wavelength of 980 nm.

Such an amplifier is then expensive to make.

OBJECTS AND SUMMARY OF THE INVENTION

A particular object of the present invention is to avoid such instability in effective manner while nevertheless reducing the cost of making the amplifier.

According to the invention, each pump injection fiber includes a photorefractive pump filter constituting part of the resonant cavity of the associated pump, the two pump filters being mutually different to give rise to an offset between the two pumping bands.

It may be observed that proposals have already been made to insert a photorefractive filter in a pump injection fiber of an optical fiber amplifier. Nevertheless, that was for an amplifier having one-way pumping. The object was to prevent heating of the pump giving rise to drift in the pumping band.

BRIEF DESCRIPTION OF THE DRAWING

There follows a more detailed description of how the present invention may be implemented, the description being given by way of non-limiting example and with reference to the accompanying diagrammatic FIGURE.

The FIGURE shows an amplifier of the present invention.

MORE DETAILED DESCRIPTION

In the FIGURE there can be seen: an amplifying fiber FA extending between two ends E1 and E2, two pumps P1 and P2 each generating a respective pump wave W1 and W2, two pump injection fibers F1 and F2, two multiplexers M1 and M2 connecting the fibers to the amplifying fiber, and two pump filters B1 and B2.

An input signal S1 is injected into the fiber FA via an optical isolator K and the multiplexer M1 connected in series, it being possible to place the isolator upstream or downstream relative to the multiplexer. After being amplified in the fiber, the signal gives rise to an output signal S2 of greater power which is delivered via the multiplexer M2.

The stimulated emission medium of each pump P1 or P2 is preferably limited between firstly an outlet face T1 or T2 connecting said medium to the pump injection fiber F1 or F2 associated with the pump, and secondly a reflection face R1 or R2 having greater reflectance than the outlet face. The reflectances and the parameters of the pump filters are selected so that a resonant cavity for each pump is constituted between the reflection face and the pump filter B1 or B2 formed in the corresponding injection fiber, thereby determining, at least in part, the position and the width of the pumping band.

The two pumping bands are preferably mutually offset by a value of several nanometers. Compared with the previously-indicated known disposition, this separation is facilitated for the following reasons:

It is relatively easy to make a photorefractive grating having a determined pitch and thus a determined central wavelength for reflection. It is easy to impart thereto length and refractive index contrast that are predetermined so that the spectrum bandwidth of reflection is determined. The use of such a grating thus makes it possible simultaneously to reduce the width of the pumping band and to position said band more accurately within the spectrum.

Typically, each pump is constituted by a semiconductor laser diode provided with a leader fiber or "pig-tail" which is included in the pump injection fiber. The photorefractive filter is preferably implemented in the leader fiber.

By way of example, the pumps are constituted by laser diodes based on InP if they are to operate at around 1480 nm, or based on GaAs if they are to operate around 980 nm.

I claim:

1. An optical fiber amplifier with bi-directional pumping, the amplifier comprising:

an amplifying fiber for receiving and amplifying optical signals, said amplifying fiber having first and second ends;

first and second pumps for providing first and second pumping waves in respective first and second pumping bands, each pump comprising a stimulated emission structure having a resonant cavity;

first and second injection fibers for injecting the pumping waves from the respective first and second pumps into respective ends of said amplifying fiber;

first and second photorefractive pump filters respectively disposed in said first and second injection fibers and constituting part of said resonant cavity of said first and second pumps, said first and second filters having different reflection characteristics to thereby cause a difference in the first and second pumping bands.

2. An amplifier according to claim 1, wherein said first and second pumping bands are non-overlapping.

3. An amplifier according to claim 1, wherein the stimulated emission structure of each pump includes a stimulated emission medium disposed between (i) an outlet face connecting said medium to the pump injection fiber associated with the pump, and (ii) a reflection face having a higher reflectance than said outlet face.

4. An optical amplifier according to claim 3, wherein a portion of each said injection fiber which is not part of said stimulated emission medium extends from each said outlet face to a respective photorefractive filter.

5. An amplifier according to claim 3, in which the stimulated emission medium of each pump includes a semiconductor laser diode, said diode being provided with a leader fiber in which a respective photorefractive pump filter is provided.

* * * * *